(12) United States Patent
Kim et al.

(10) Patent No.: US 7,992,296 B2
(45) Date of Patent: Aug. 9, 2011

(54) PCB AND MANUFACTURING METHOD THEREOF

(75) Inventors: Woon-Chun Kim, Suwon-si (KR); Sung Yi, Suwon-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/351,333

(22) Filed: Jan. 9, 2009

(65) Prior Publication Data

US 2009/0178840 A1 Jul. 16, 2009

(51) Int. Cl.
 *H01K 3/10* (2006.01)
(52) U.S. Cl. ............ 29/852; 29/846; 29/830; 174/266
(58) Field of Classification Search .............. 174/266; 29/846, 847, 852, 831
See application file for complete search history.

(56) References Cited

U.S. PATENT DOCUMENTS

| 7,199,970 | B2* | 4/2007 | Boss et al. | 360/97.02 |
| 7,274,099 | B2* | 9/2007 | Hsu | 257/701 |
| 7,363,706 | B2* | 4/2008 | Hirata | 29/852 |
| 2007/0015872 | A1 | 1/2007 | Arima et al. | |
| 2007/0051459 | A1* | 3/2007 | Yamano et al. | 156/253 |
| 2007/0166991 | A1* | 7/2007 | Sinha | 438/597 |
| 2007/0186414 | A1* | 8/2007 | Abe et al. | 29/830 |
| 2007/0266886 | A1* | 11/2007 | En et al. | 106/1.18 |
| 2007/0289127 | A1* | 12/2007 | Hurwitz et al. | 29/827 |

FOREIGN PATENT DOCUMENTS

| JP | 2002-246730 | 8/2002 |
| JP | 2004-319887 | 11/2004 |
| JP | 2005-236067 | 9/2005 |
| KR | 10-2007-0078086 | 7/2007 |

OTHER PUBLICATIONS

Korean Office Action issued in Korean Patent Application No. KR 10-2008-0004387 dated Jul. 29, 2010.
Korean Office Action, w/ partial English translation thereof, issued in Korean Patent Application No. KR 10-2008-0004387 dated Jan. 31, 2011.
Japanese Office Action, with Partial English Translation, issued in Japanese Patent Application No. 2009-004838, dated Apr. 5, 2011.

* cited by examiner

*Primary Examiner* — Tuan T Dinh
*Assistant Examiner* — Steven Sawyer
(74) *Attorney, Agent, or Firm* — McDermott Will & Emery LLP

(57) ABSTRACT

A printed circuit board and a manufacturing method thereof are disclosed. The method in accordance with an embodiment of the present invention includes: providing a substrate on which a first insulation layer, a first circuit pattern, a second insulation layer and a resin layer are successively laminated; boring a through-hole penetrating the substrate; forming roughness on the resin layer by a desmear process; forming a via making an electrical connection between layers through the through-hole; and forming a second circuit pattern on the resin layer having roughness formed thereon.

4 Claims, 27 Drawing Sheets

PCB AND MANUFACTURING METHOD THEREOF

CROSS-REFERENCE TO RELATED APPLICATIONS

This application claims the benefit of Korean Patent Application No. 10-2008-0004387, filed with the Korean Intellectual Property Office on Jan. 15, 2008, the disclosure of which is incorporated herein by reference in its entirety.

BACKGROUND

1. Technical Field

The present invention relates to a PCB and a method of manufacturing the same.

2. Description of the Related Art

As electronic devices become increasingly smaller, lighter and faster, the circuit patterns of printed circuit boards are required to be denser.

In the past, after an Ajinomoto Build-up film (ABF) is laminated and is desmeared for the purpose of forming roughness in order to improve the adhesive strength between a plated layer and the ABF, a fine circuit is formed by an additive way using electroless plating or electrolytic plating.

However, when rigidity is required but warpage may occur, the ABF is not usable and prepreg should be used instead. If the prepreg is used as a laminate, roughness cannot be formed by desmearing. To overcome this problem, a circuit is formed by laminating a copper foil and the prepreg together and etching the copper foil. However, such a method is limited in forming a fine pattern as compared with the method using the ABF.

Conventionally, a method according to FIGS. 1 through 5 has been used to form a fine pattern.

In order to form a fine pattern on an insulation layer 12, such as the prepreg on which a fine pattern is difficult to be formed, a plate member 11 has been used in the past as shown in FIG. 1, which consists of a copper foil 111 and a thin film resin layer 112 on which roughness cannot be formed thereon. The thin film resin layer 112 is laminated on the copper foil 111. When the plate member 11 is laminated on the insulation layer 12 and the copper foil is removed, the thin film resin layer 112 performs a function of transferring the roughness of the copper foil 111 to the thin film resin layer 112. Accordingly, the copper foil 111 having coarse roughness causes the roughness transferred to the thin film resin layer 112 to be increased such that it is possible to obtain sufficient adhesive strength between the thin film resin layer 112 and the plated layer formed by electroless plating and electrolytic plating in accordance with the additive way. However, as described below, there arises a serious problem of getting core-copper foils 131 and 133 damaged.

The method of forming a fine pattern is as follows. As shown in FIGS. 1 through 5, the plate member 11, the insulation layer 12 and a copper clad laminate 13 having a circuit formed therein are successively laminated and pressed, and then are shaped as shown in FIG. 2. Subsequently, a through-hole 14 is formed as shown in FIG. 3. As shown in FIG. 4, the through-hole 14 is desmeared without removing the copper foil 111 in order to protect the thin film resin layer 112. If the desmear process is performed after removing the copper foil 111, the thin film resin layer 112 is exposed to a desmear solution and damaged. As a result, since the roughness formed on the thin film resin layer 112 is reduced, there occurs a problem in the adhesive strength.

As shown in FIG. 5, the copper foil 111 is removed. In this case, there is a serious problem that etching solution is leaked into the through-hole 14, and then the inner copper foils 131 and 133 are damaged. Consequently, by using the plate member 11 having the laminated thin film resin layer 112 which cannot have roughness, a fine pattern can be formed on the insulation layer 12 on which a fine pattern is difficult to be formed, but the core-copper foils 131 and 133 are damaged.

SUMMARY

The present invention provides a printed circuit board and a manufacturing method thereof, in which a fine circuit pattern can be formed more easily by using a resin layer on which roughness can be formed thereon, through a desmear process.

An aspect of the present invention features a method of manufacturing a printed circuit board. The method in accordance with an embodiment of the present invention includes: providing a substrate on which a first insulation layer, a first circuit pattern, a second insulation layer and a resin layer are successively laminated; boring a through-hole penetrating the substrate; forming roughness on the resin layer by a desmear process; forming a via making an electrical connection between layers through the through-hole; and forming a second circuit pattern on the resin layer having roughness formed thereon.

The forming of the via and the forming of the second circuit pattern can be simultaneously performed by, after forming the roughness: forming a seed layer on the resin layer and on an inner wall of the through-hole; forming a plating resist on the seed layer, the plating resist corresponding to the via and the second circuit pattern; performing electrolytic plating; removing the plating resist; and performing flash etching.

The substrate can be manufactured by: providing a first member having the first insulation layer and the first circuit pattern laminated thereon; providing a second member having the resin layer and a metal layer laminated thereon; compressing the first member and the second member by interposing the second insulation layer such that the first circuit pattern faces the resin layer; and removing the metal layer.

The second insulation layer can be in a B-stage phase. The removing of the metal layer can be performed by wet etching.

Another aspect of the present invention features a manufacturing a printed circuit board. The printed circuit board in accordance with an embodiment of the present invention includes: a first insulation layer; a first circuit pattern laminated on the first insulation layer; a second insulation layer laminated on the first insulation layer such that the first circuit pattern is covered; a resin layer laminated on the second insulation layer and having roughness formed thereon; a second circuit pattern formed on the resin layer; and a via electrically connected with the second circuit pattern and penetrating the first insulation layer, the first circuit pattern and the second insulation layer.

DETAILED DESCRIPTION

Figure 1:
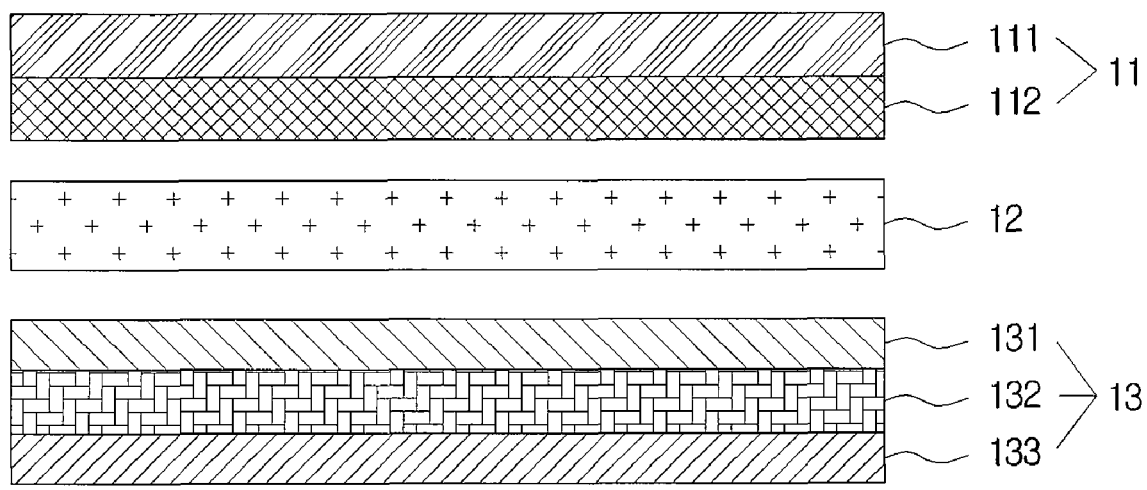
FIGS. 1 through 5 show a process of manufacturing a printed circuit board in accordance with a conventional technology.
Figure 2:
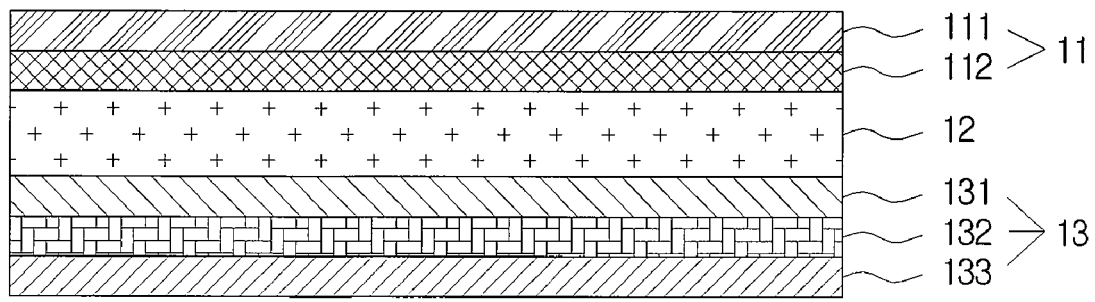
Figure 3:
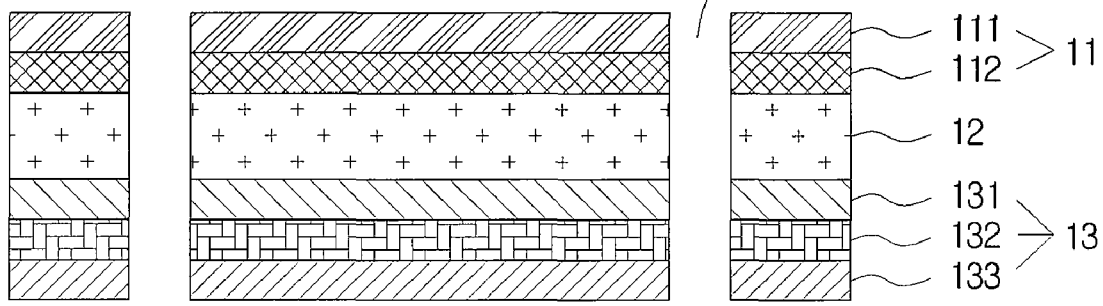
Figure 4:
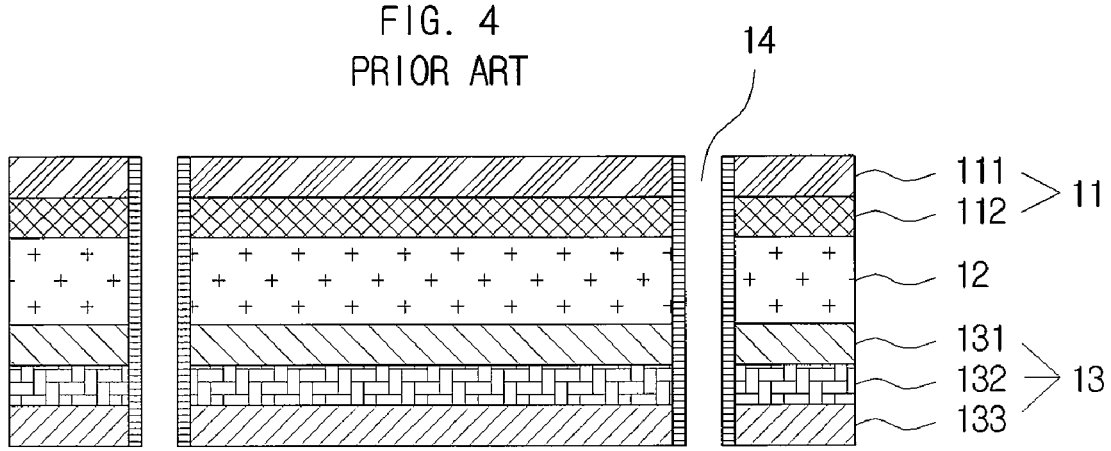
Figure 5:
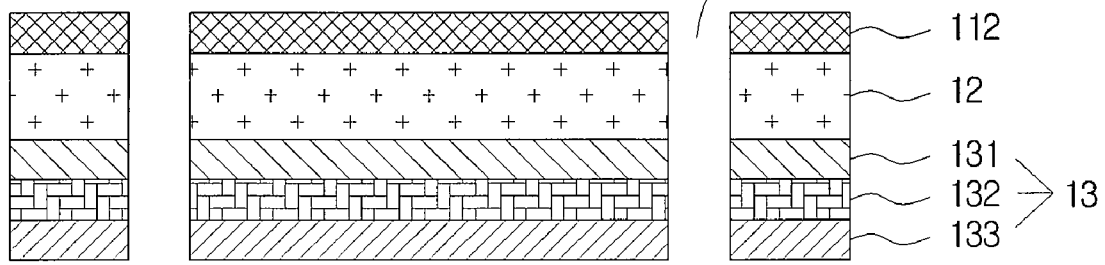

Hereinafter, an embodiment of a method of manufacturing a printed circuit board will be described in more detail with reference to the accompanying drawings. In description with reference to the accompanying drawings, the same reference numerals will be given to the same or corresponding elements irrespective of the drawing numbers, and repetitive descriptions thereof will be omitted.

Figure 6:
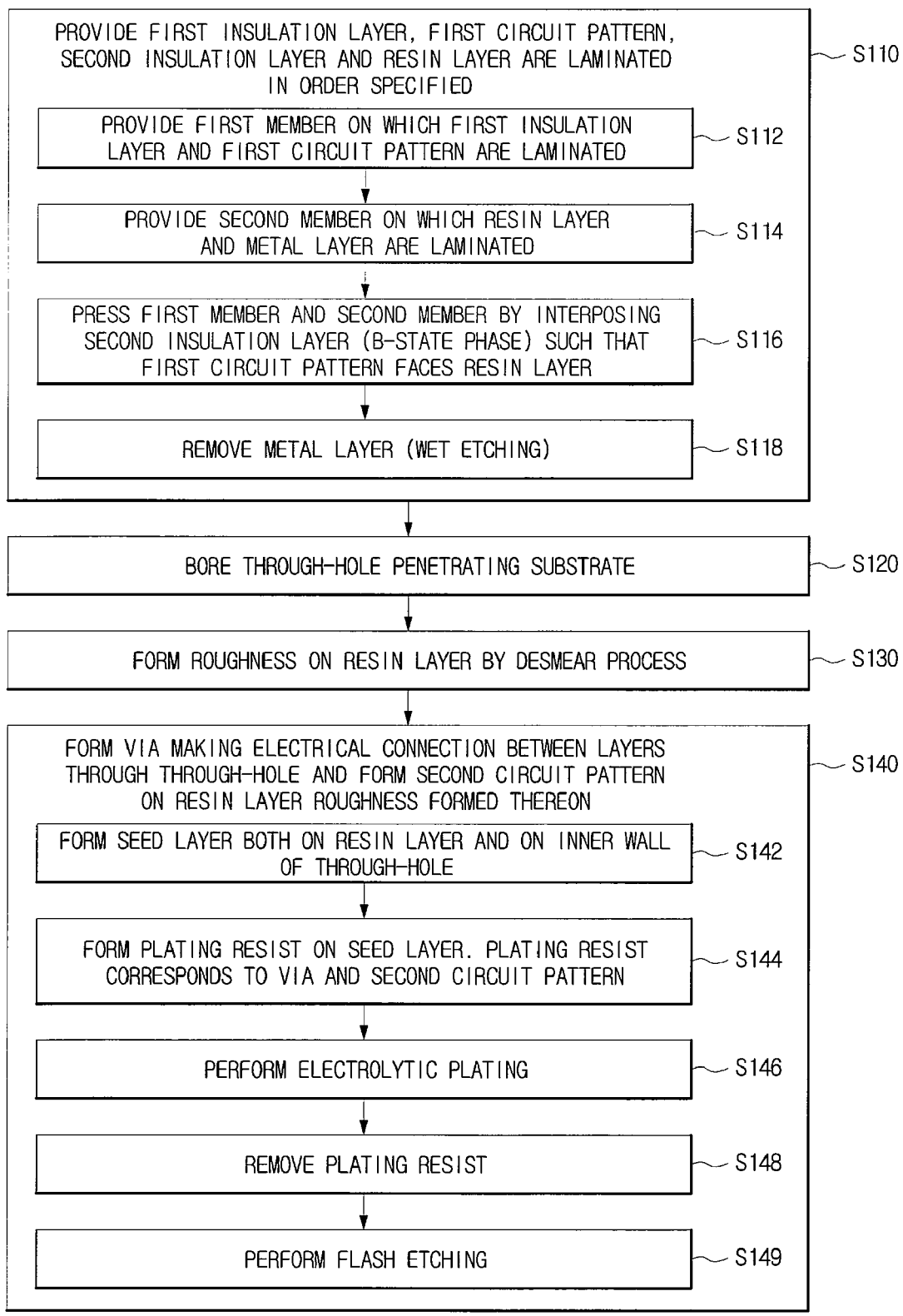
FIG. 6 is a flowchart showing a first embodiment of a method of manufacturing a printed circuit board in accordance with an aspect of the present invention.

FIG. 6 is a flowchart showing a first embodiment of a method of manufacturing a printed circuit board in accordance with an aspect of the present invention. FIGS. 7 through 16 are cross sectional views showing each respective process of a first embodiment of a method of manufacturing a printed circuit board in accordance with an aspect of the present invention. Illustrated in FIGS. 7 through 16 are a metal layer 211, resin layers 212 and 212', a second member 21, a first member 23, a first insulation layer 232, a first circuit pattern 231, a second insulation layer 22, a through-hole 24, a seed layer 26, a plating resist 27, a second circuit pattern 28 and a via 29.

Figure 7:
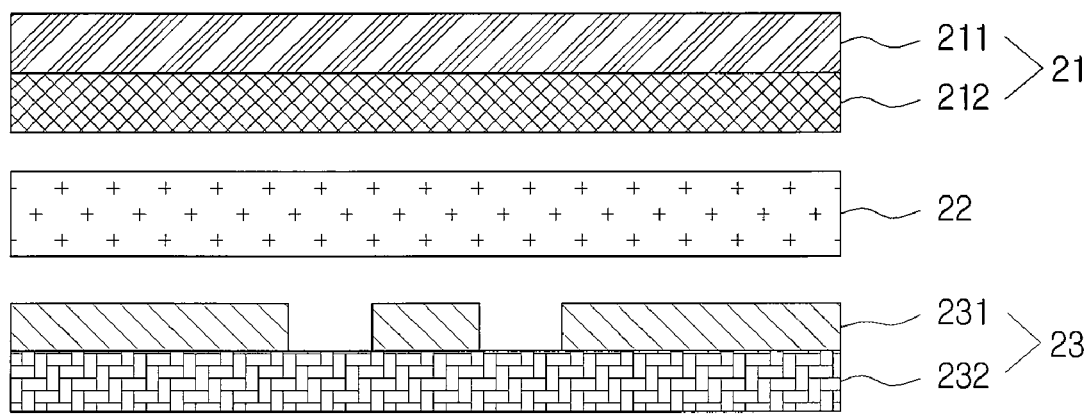
FIGS. 7 through 16 are cross sectional views showing each respective process of a first embodiment of a method of manufacturing a printed circuit board in accordance with an aspect of the present invention.
Figure 8:
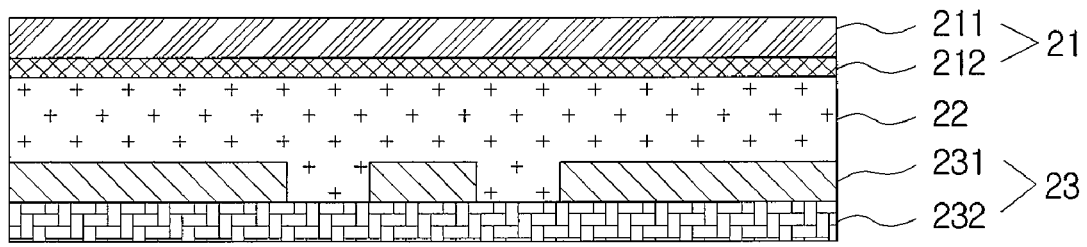
Figure 9:
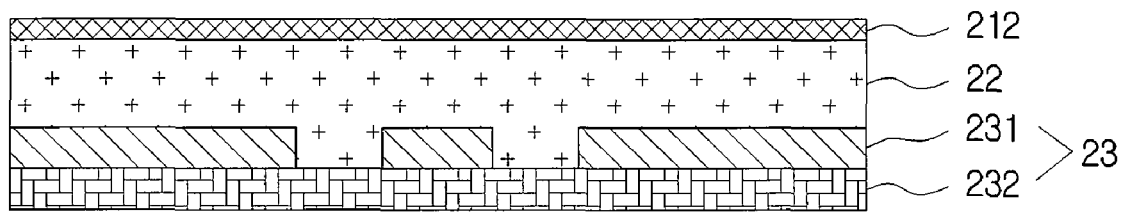

First, as shown in FIGS. 7 through 9, provided is a substrate on which a first insulation layer 232, a first circuit pattern 231, a second insulation layer 22 and a resin layer 212 are laminated in the order specified (S110). The providing of the substrate can be described stage by stage as follows.

As shown in FIG. 7, a first member 23 on which the first insulation layer 232 and the first circuit pattern 231 are laminated is provided (S112). A second member 21 on which the resin layer 212 and a metal layer 211 are laminated is provided (S114).

The first member 23 can be shaped such that the first insulation layer 232 and the first circuit pattern 231 are laminated thereon. In the embodiment of the present invention, it is possible to provide the first member 23 having the first circuit pattern 231 formed on one surface of the first insulation layer 232 by etching and removing a part of the copper layer of a copper clad laminate (CCL).

The second member 21 is shaped such that the resin layer 212 on which roughness can be formed by desmearing is laminated on the metal layer 211. The metal layer 211 can be a copper foil, and is able to function as a carrier. The resin layer 212 on which roughness can be formed thereon by desmearing is made of a material which cannot be completely removed due to its tolerance even when the resin layer 212 is exposed to the desmear process. Roughness can be formed on the surface of the material when the desmear process is performed.

In this case, the resin layer 212 can be used in the form of a thin film. Therefore, it is possible to form roughness on the surface of the resin layer 211 without greatly changing the thickness of the entire substrate.

An adhesive disclosed in the publication of Korean patent application No. 10-2007-0078086 (Applicant: Mitsubishi Gas Chemical Company) may be used for such a thin film resin layer 212 on which roughness can be formed by desmearing. The adhesive mentioned in the published patent is not completely removed in spite of being exposed to the desmear process.

The resin layer 212 on which roughness can be formed by desmearing can be laminated on the metal layer 211 by coating.

As shown in FIG. 8, the second insulation layer 22 (B-state phase) is interposed. The first member 23 and the second member 21 are pressed to each other such that the first circuit pattern 231 faces the resin layer 212 (S116). When the second member 21 is laminated on the first member 23, the resin layer 212 on which roughness can be formed by desmearing faces the first member 23 such that the resin layer 212 on which roughness can be formed by desmearing is not exposed to the outside. As a result, the metal layer 211 is able to not only function as a carrier but also protect the resin layer 212 on which roughness can be formed by desmearing In this case, the second insulation layer 22 can be made of a material in a B-stage phase. In case a material on which roughness is not sufficiently formed on the surface thereof even by a desmear process is used for the second insulation layer 22, a fine second circuit pattern 28 can be formed in a semi-additive process by desmearing the resin layer 212 and increasing the adhesive strength of the surface.

As shown in FIG. 9, the metal layer 211 is removed by wet etching (S118). The metal layer 211 can be a copper foil and removed by being exposed to an etching solution. Eventually, as shown in FIG. 9, only the thin film resin layer 212 on which roughness can be formed by desmearing remains in the second member 21.

Figure 10:
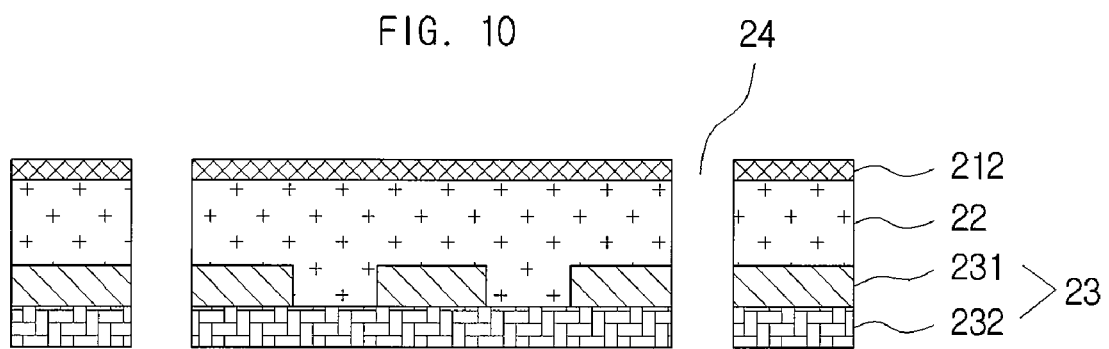

Then, as shown in FIG. 10, a through-hole 24 penetrating the substrate is bored (S120). Since the through-hole 24 is plated with copper in the following process, a via 29 can hereby be formed. The via 29 that is formed by copper-plating on the through-hole 24 is able to electrically connect the first circuit pattern 231 and the second circuit pattern 28. Meanwhile, because the through-hole 24 is bored by a drill, the inside of the through-hole 24 becomes smeared.

Figure 11:
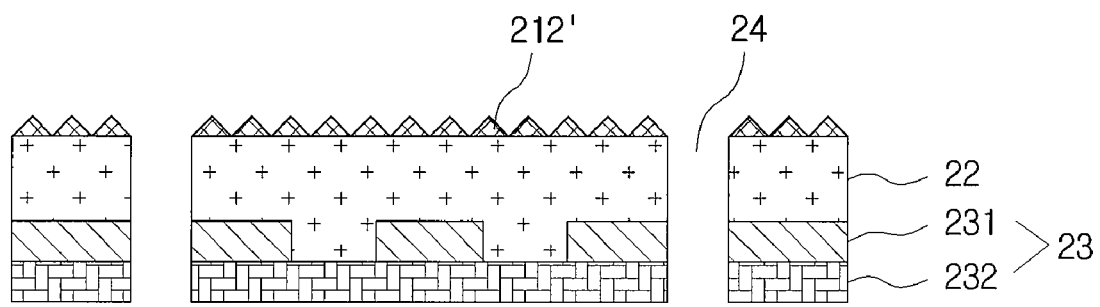

As shown in FIG. 11, roughness is formed on a resin layer 212' by a desmear process (S130). In this process for removing the smear, roughness can be formed as shown in FIG. 11 on the resin layer 212' on which roughness can be formed by desmearing. When a seed layer 26 is laminated later, such roughness widens the surface area, thereby improving the adhesive strength of the seed layer 26. The resin layer 212' on which roughness can be formed by desmearing, as described above, is not completely removed in spite of being exposed to the desmear process.

As described above, after the metal layer 211 is etched in step S118, the through-hole 24 is formed in step S120 and the desmear process is performed in step S130. As a result, the first circuit pattern 231 exposed to the inside of the through-hole 23 is not damaged by etching solution. Accordingly, the reliability of a printed circuit board is not deteriorated by the damage of the first circuit pattern 231.

As shown in FIGS. 12 through 16, the via 29 making an electrical connection between layers through the through-hole 24 is formed and the second circuit pattern is formed on the resin layer 212' having roughness formed thereon (S140). The forming of the via 29 and the second circuit pattern 28 can be described stage by stage as follows.

Figure 12:
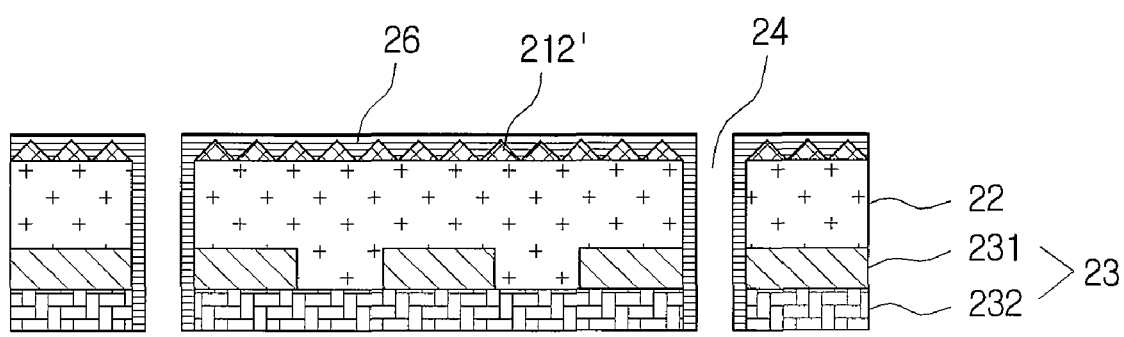

As shown in FIG. 12, the seed layer 26 is formed both on the resin layer 212' and on the inner wall of the through-hole 24 (S142). That is, in order to form the second circuit pattern 28 and the via 29 in the semi-additive process, the seed layer 26, i.e., a base layer for electrolytic plating, is formed both on the resin layer 212' and on the inner wall of the through-hole 24.

Figure 13:
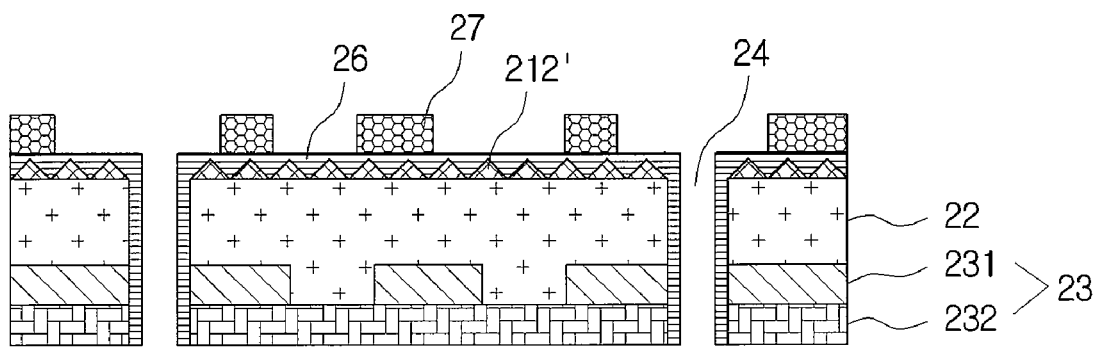

As shown in FIG. 13, a plating resist 27 is formed on the seed layer 26 (S144). The plating resist 27 corresponds to the via 29 and the second circuit pattern 28. In other words, if a photosensitive material is spread on the seed layer 26 and then exposed to light and developed with the consideration of positions the second circuit pattern 28 and the via 29 to be formed, the plating resist 27 can be formed.

Figure 14:
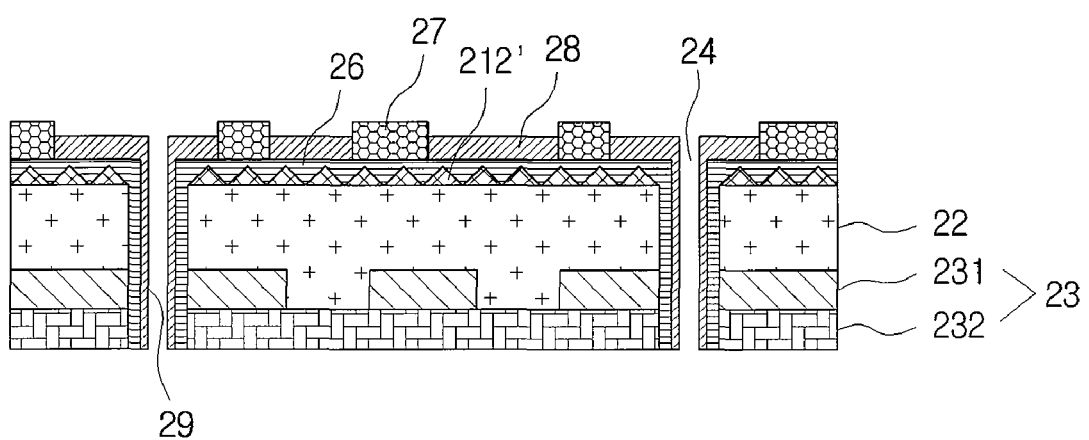
Figure 15:
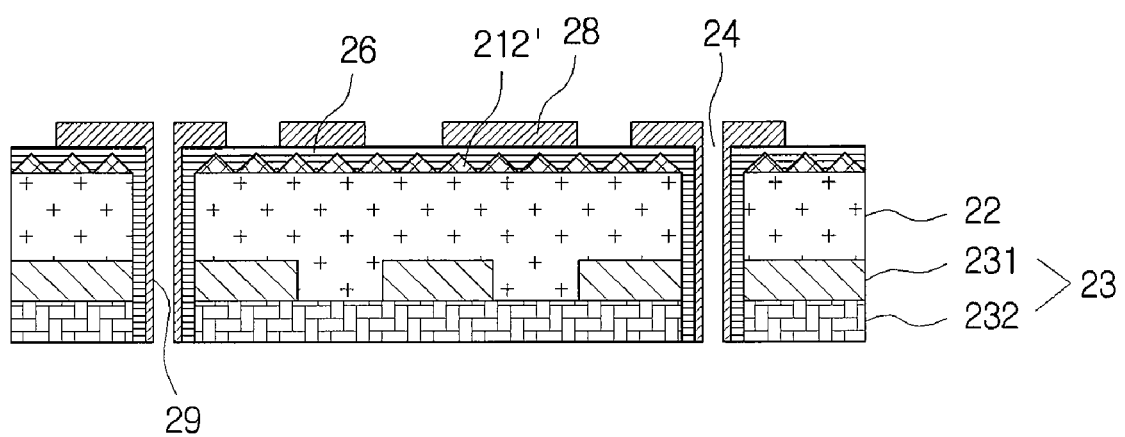
Figure 16:
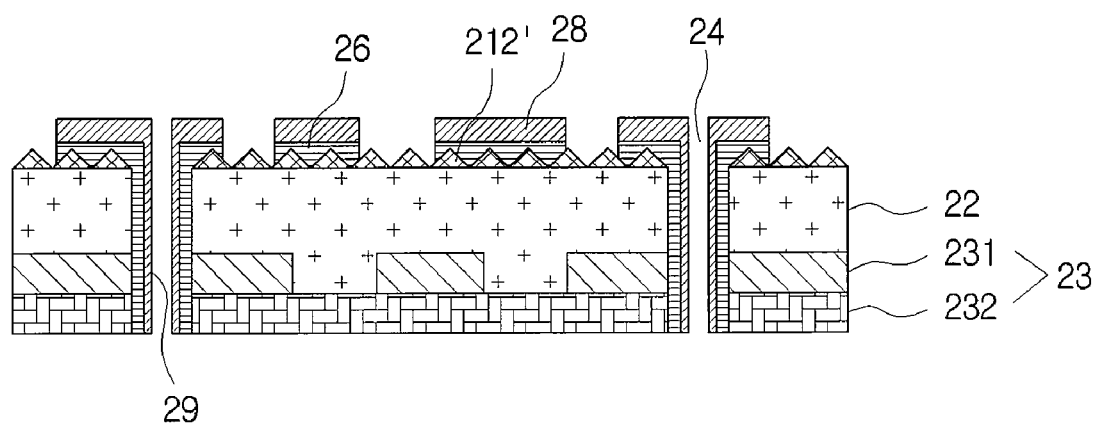

Subsequently, after performing the electrolytic plating as shown in FIG. 14 (S146), the plating resist is removed as shown in FIG. 15 (S148). As shown in FIG. 16, flash etching is performed (S149). That is, after the electrolytic plating, a printed circuit board is completed by exfoliating the plating resist 27 and flash etching the seed layer 26.

In the embodiment of the present invention, while the second circuit pattern 28 is formed in the semi-additive process by use of the seed layer 26, it shall be evident that the second circuit pattern 28 can be also formed by various known methods.

Next, a second embodiment of a method of manufacturing a printed circuit board in accordance with an aspect of the present invention will be described.

Figure 17:
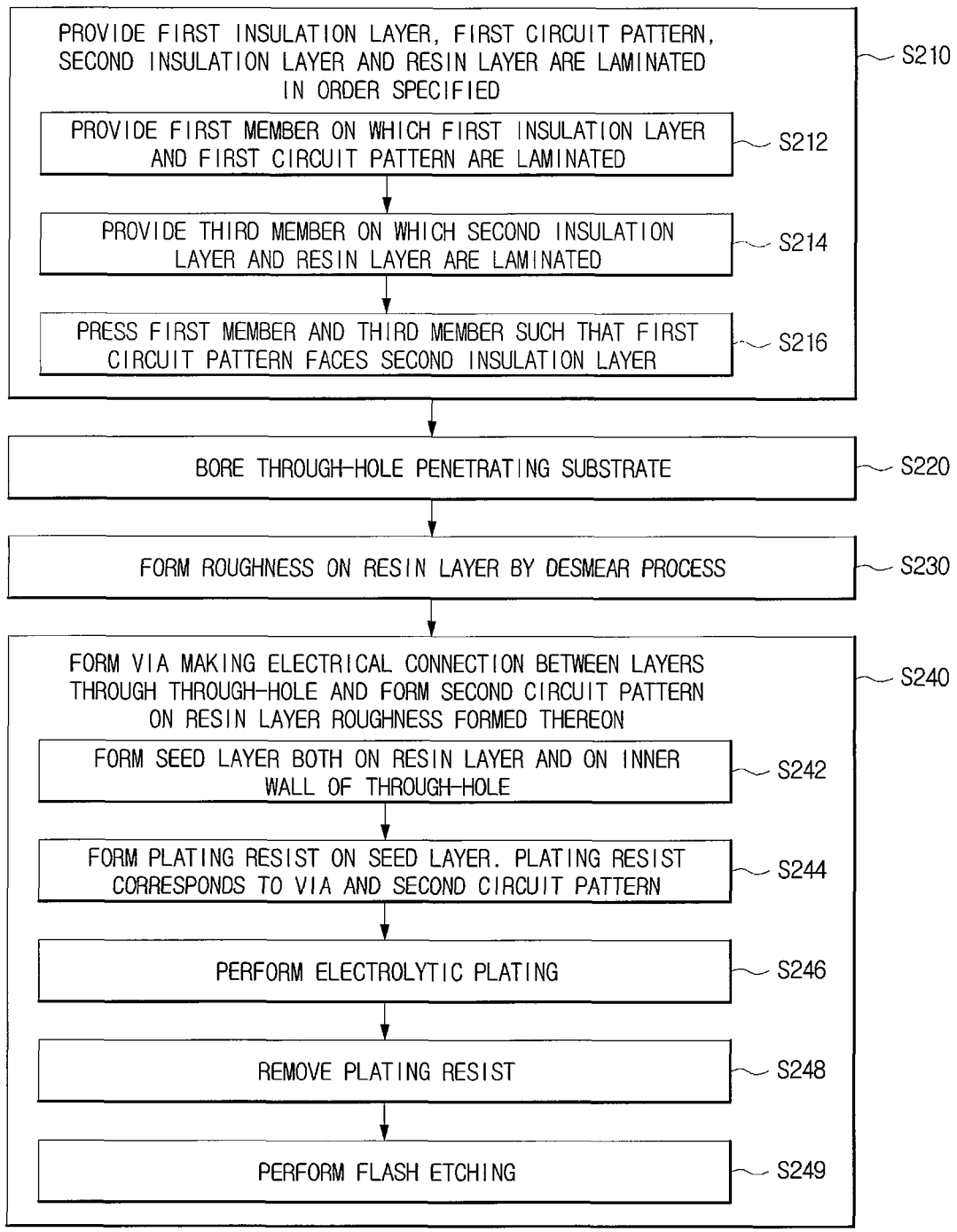
FIG. 17 is a flowchart showing a second embodiment of a method of manufacturing a printed circuit board in accordance with an aspect of the present invention.

FIG. 17 is a flowchart showing a second embodiment of a method of manufacturing a printed circuit board in accordance with an aspect of the present invention. FIGS. 18 through 26 are cross sectional views showing each respective process of a second embodiment of a method of manufacturing a printed circuit board in accordance with an aspect of the present invention. Illustrated in FIGS. 17 through 26 are resin layers 312 and 312', a second insulation layer 32, a third member 35, a first insulation layer 332, a first circuit pattern 331, a first member 33, a through-hole 34, a seed layer 36, a plating resist 37, a second circuit pattern 38 and a via 39.

Figure 18:
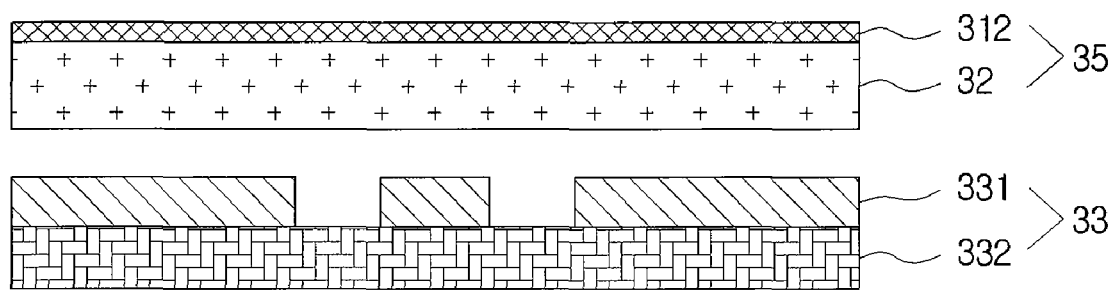
FIGS. 18 through 26 are cross sectional views showing each respective process of a second embodiment of a method of manufacturing a printed circuit board in accordance with an aspect of the present invention.
Figure 19:
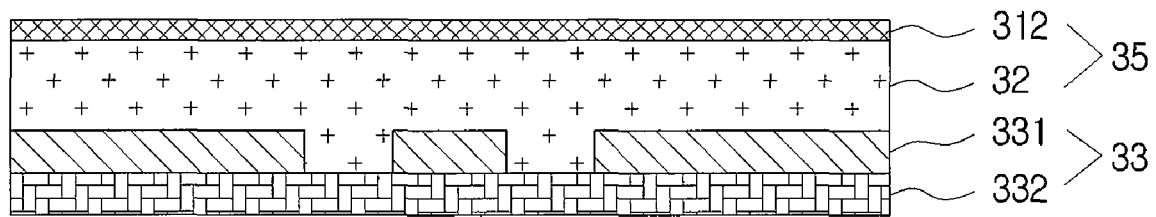

First, as shown in FIGS. 18 and 19, provided is a substrate on which a first insulation layer 332, a first circuit pattern 331, a second insulation layer 32 and a resin layer 312 are successively laminated in the order specified (S210). The substrate can be described stage by stage in the following process.

As shown in FIG. 18, a first member 33 on which the first insulation layer 332 and the first circuit pattern 331 are laminated is provided (S212). A third member 35 on which the second insulation layer 32 and the resin layer 312 are laminated is provided (S214). As shown in FIG. 19, the first member 33 and the third member 35 are pressed to each other such that the first circuit pattern 331 faces the second insulation layer 32 (S216).

Figure 20:
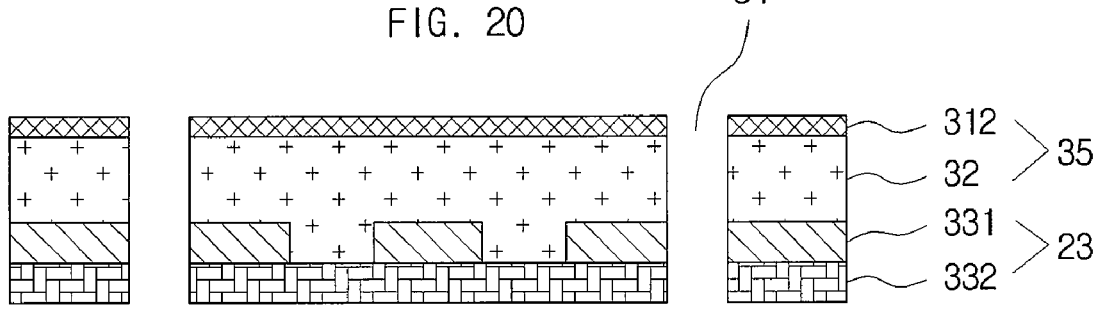
Figure 21:
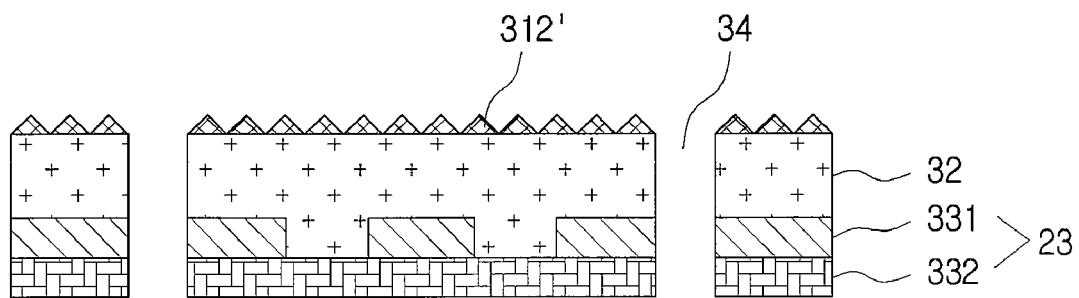

In the next step, as shown in FIG. 20, a through-hole 34 penetrating the substrate is bored (S220). As shown in FIG. 21, roughness is formed on a resin layer 312' by a desmear process (S230).

As shown FIGS. 22 through 26, a via 39 making an electrical connection between layers is formed and a second circuit pattern 38 is formed on the resin layer 312' having roughness formed thereon (S240). This can be described stage by stage as follows.

Figure 22:
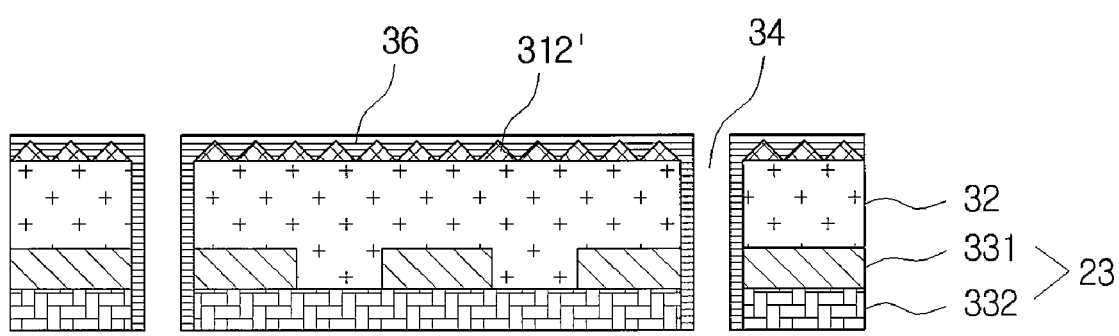
Figure 23:
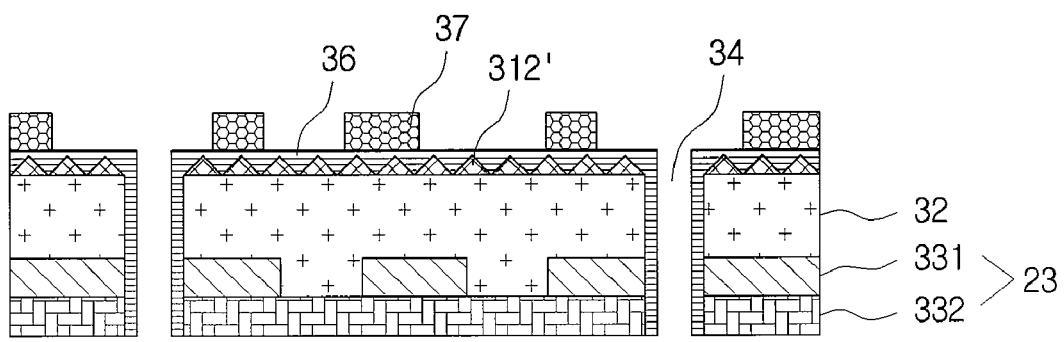
Figure 24:
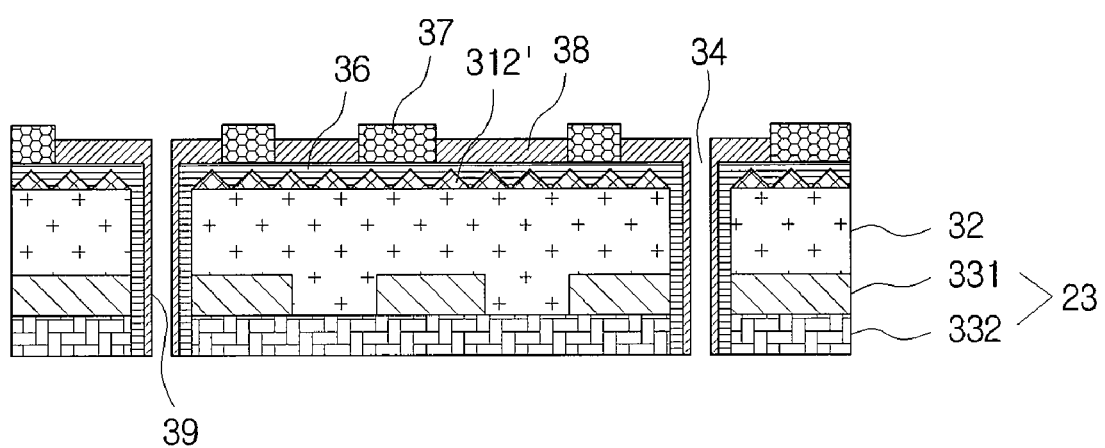
Figure 25:
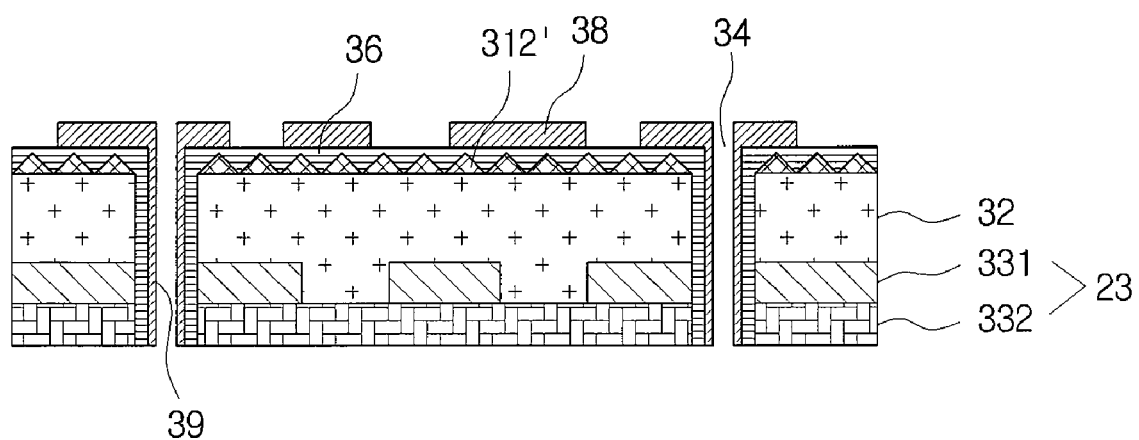
Figure 26:
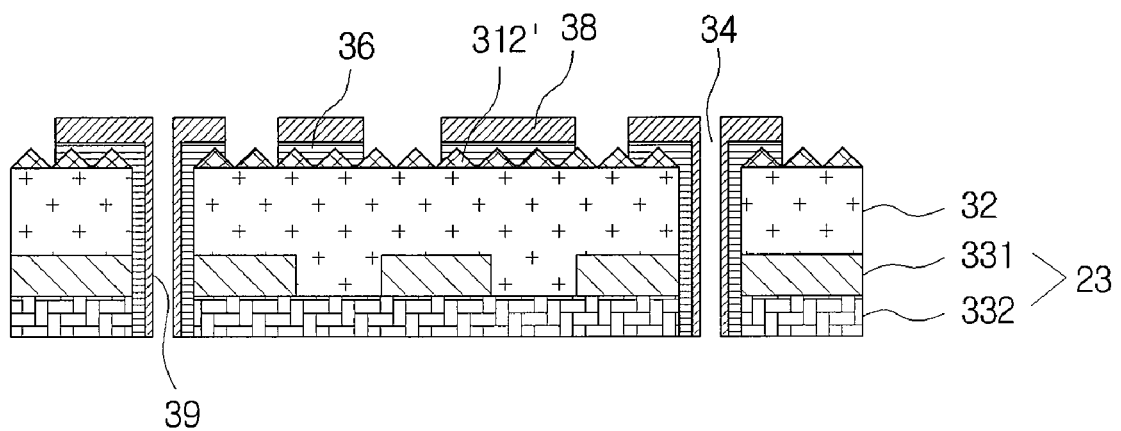

As shown in FIG. 22, a seed layer 36 is formed both on the resin layer 312' and on the inner wall of the through-hole 34 (S242). As shown in FIG. 23, a plating resist 37 is formed on the seed layer 36 (S244). The plating resist corresponds to the via 39 and the second circuit pattern 38. After performing the electrolytic plating as shown in FIG. 24 (S246), the plating resist 37 is removed as shown in FIG. 25 (S248), and then flash etching is performed as shown in FIG. 26 (S249).

In the embodiment of the present invention, since the steps of S210, S212, S214 and S216 are the same as or correspond to those of the first embodiment described above as shown in FIGS. 18 through 26, descriptions thereof will be omitted. Hereinafter, the difference from the first embodiment described above, that is, a process of providing a substrate on which the first insulation layer 332, the first circuit pattern 331, the second insulation layer 32 and the resin layer 312 are successively laminated in the order specified (S210) will be described.

First, as shown in FIGS. 18 and 19, provided is a substrate on which the first insulation layer 332, the first circuit pattern 331, the second insulation layer 32 and the resin layer 312 are successively laminated in the order specified (S210). The substrate can be described stage by stage in the following process.

As shown in FIG. 18, the first member 33 on which the first insulation layer 332 and the first circuit pattern 331 are laminated is provided (S212). The third member 35 on which the second insulation layer 32 and the resin layer 312 are laminated is provided (S214).

Here, the first member 33 can consist of the first insulation layer 332 and the first circuit pattern 331 formed on the first insulation layer 332. The third member 35 can consist of the second insulation layer 32 and the resin layer 312 laminated on the second insulation layer 32.

Since the first insulation layer 332, the first circuit pattern 331, the third member 35 and the resin layer 312 are the same as those of the first embodiment, descriptions thereof will be omitted.

Then, as shown in FIG. 19, the first member 33 and the third member 35 are compressed to each other such that the first circuit pattern 331 faces the second insulation layer 32 (S216).

As the third member 35 consists of the second insulation layer 32 and the resin layer 312, it is possible to simply perform the following process without a separate process after the first member 33 and the third member 35 are compressed to each other. Accordingly, the printed circuit board can be more effectively manufactured.

Next, an embodiment of a method of manufacturing a printed circuit board in accordance with another aspect of the present invention will be described.

Figure 27:
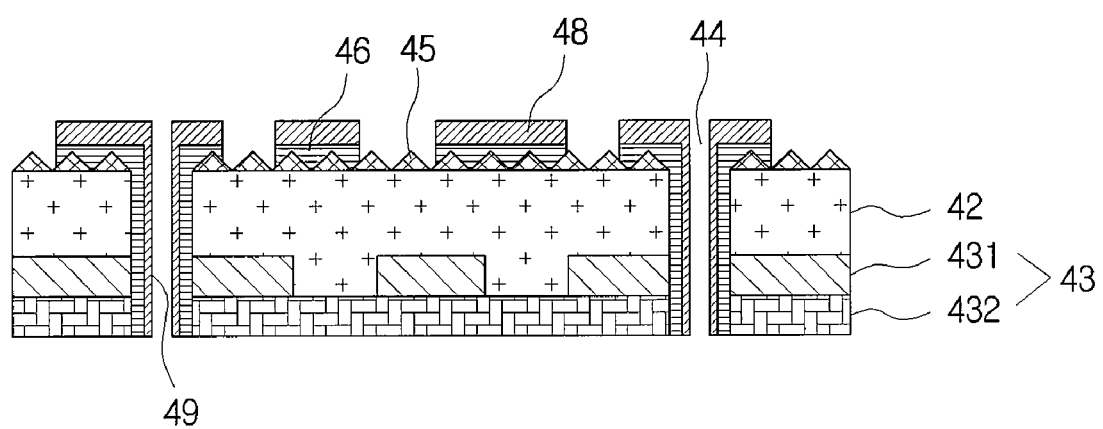
FIG. 27 is a cross sectional view showing an embodiment of a printed circuit board in accordance with another aspect of the present invention.

FIG. 27 is a cross sectional view showing an embodiment of a printed circuit board in accordance with another aspect of the present invention. Illustrated in FIG. 27 are a resin layer 45, a first member 43, a first insulation layer 432, a first circuit pattern 431, a second insulation layer 42, a through-hole 44, a seed layer 46, a second circuit pattern 48 and a via 49.

In the embodiment of the present invention, a thin film resin layer 45 is formed, which has roughness formed on a first member 43 consisting of a first insulation layer 432 and a first circuit pattern 431. A seed layer 46 and a second circuit pattern 48 are successively laminated on the resin layer 45.

The first member 43 can consist of the first insulation layer 432 and the first circuit pattern 431. For example, the first member 43 can be manufactured by selectively removing a part of a copper layer of the copper clad laminate.

The second insulation layer 42 can be laminated on the first insulation layer 432 such that the first circuit pattern 431 is covered, and can be hardened by hot compression after being laminated by use of, for example, a material in B-stage phase. Even though a material on which roughness is difficult to be formed by a desmear process is used for the second insulation layer 42, the adhesive strength is increased due to the rough surface formed on the resin layer 45 being formed on the second insulation layer 42. Accordingly, it is possible to form a fine circuit pattern.

Because the upper surface of the second insulation layer 42 has an adhesive property, the resin layer 45 is laminated on the second insulation layer 42. The resin layer 45 has roughness formed on the surface thereof and can improve the adhesive strength to the fine circuit pattern. That is to say, as described in the first embodiment of the method of manufacturing the printed circuit board mentioned above, roughness can be formed on the resin layer 45 by a desmear process. As a result, the contact area with the seed layer 46 is increased, and the adhesive strength is also increased.

In this case, since the resin layer 45 can be made of thin film resin, a fine circuit pattern can be formed without greatly changing the thickness of the entire substrate.

The second circuit pattern 48 can be formed on the resin layer 45. The via 49 is electrically connected with the second circuit pattern 48, and able to penetrate through the first insulation layer 432, the first circuit pattern 431 and the second insulation layer 42.

As described in the first embodiment of the method of manufacturing the printed circuit board mentioned above, the second circuit pattern 48 and the via 49 can be formed on the resin layer 45 and the through-hole 44 by the semi-additive process. Here, since the adhesive strength between the resin layer 45 and the seed layer 46 is increased by the roughness formed on the resin layer 45, the fine second circuit pattern 48 can be formed more easily and effectively.

While certain embodiments of the present invention have been described, it shall be understood by those skilled in the art that various changes and modification in forms and details can be made without departing from the spirit and scope of the present invention as defined by the appended claims.

What is claimed is:

1. A method of manufacturing a printed circuit board, the method comprising:
   providing a substrate on which a first insulation layer, a first circuit pattern, a second insulation layer and a resin layer are successively laminated;
   boring a through-hole penetrating the substrate, the first insulation layer, the first circuit pattern, the second insulation layer and the resin layer by a drill such that an inside of the through-hole becomes smeared;
   removing a smear of the inside of the through-hole by a desmear process to form roughness on the resin layer;
   forming a via making an electrical connection between layers through the through-hole; and
   forming a second circuit pattern on the resin layer having roughness formed thereon, wherein the forming the via and the forming the second circuit pattern are simultaneously performed after forming the roughness, the forming the via and the forming the second circuit pattern include steps of:
      forming a seed layer on the resin layer and on an inner wall of the through-hole;
      forming a plating resist on the seed layer, the plating resist corresponding toe the via and the second circuit pattern;
      performing electrolytic plating;
      removing the plating resist; and
      performing flash etching.

2. The method of claim 1, wherein the substrate is manufactured by:
   providing a first member having the first insulation layer and the first circuit pattern laminated thereon;
   providing a second member having the resin layer and a metal layer laminated thereon;
   compressing the first member and the second member by interposing the second insulation layer such that the first circuit pattern faces the resin layer; and
   removing the metal layer.

3. The method of claim 2, wherein the second insulation layer is in a B-stage phase.

4. The method of claim 2, wherein the removing of the metal layer is performed by wet etching.

* * * * *